(12) United States Patent
Ilyas et al.

(10) Patent No.: US 11,569,796 B2
(45) Date of Patent: Jan. 31, 2023

(54) MEMS-BASED PASSBAND FILTER

(71) Applicant: KING ABDULLAH UNIVERSITY OF SCIENCE AND TECHNOLOGY, Thuwal (SA)

(72) Inventors: Saad Ilyas, Thuwal (SA); Mohammad Ibrahim Younis, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 179 days.

(21) Appl. No.: 16/627,530

(22) PCT Filed: Dec. 5, 2017

(86) PCT No.: PCT/IB2017/057664
§ 371 (c)(1),
(2) Date: Dec. 30, 2019

(87) PCT Pub. No.: WO2019/021047
PCT Pub. Date: Jan. 31, 2019

(65) Prior Publication Data
US 2020/0127642 A1 Apr. 23, 2020

Related U.S. Application Data

(60) Provisional application No. 62/537,226, filed on Jul. 26, 2017.

(51) Int. Cl.
*H03H 9/46* (2006.01)
*H03H 3/007* (2006.01)
(Continued)

(52) U.S. Cl.
CPC .......... *H03H 9/465* (2013.01); *H03H 3/0073* (2013.01); *H03H 9/2463* (2013.01); *H03H 11/04* (2013.01)

(58) Field of Classification Search
CPC .... H03H 3/0073; H03H 11/04; H03H 9/2463; H03H 9/465
See application file for complete search history.

(56) References Cited

U.S. PATENT DOCUMENTS

| 6,930,569 B2* | 8/2005 | Hsu .................. H03H 3/0072 310/348 |
| 9,680,414 B1* | 6/2017 | Chen ..................... H03L 5/00 |
| 2004/0058591 A1 | 3/2004 | Avazi et al. |

OTHER PUBLICATIONS

Bannon, F.D. et al., "High-Q HF Microelectromechanical Filters," IEEE Journal of Solid-State Circuits, Apr. 2000, vol. 35, No. 4, pp. 512-525, IEEE.

(Continued)

*Primary Examiner* — Ryan Johnson
*Assistant Examiner* — Colleen J O Toole
(74) *Attorney, Agent, or Firm* — Patent Portfolio Builders PLLC

(57) ABSTRACT

A passband filter includes a first and second microelectromechanical resonator system, each including a resonating beam, a drive electrode, and a sense electrode. An AC input signal is coupled to the drive electrode of the first and second microelectromechanical resonator system. A differential-to-single ended amplifier has a first input and second input respectively coupled to the sense electrodes of the first and second microelectromechanical resonator systems. An output of the differential-to-single ended amplifier is an output of the passband filter that provides a bandpass filtered signal of the AC input signal. A DC bias signal is coupled to the resonating beams of the first and second microelectromechanical resonator systems. The first microelectromechanical resonator system exhibits a hardening nonlinear behavior defining an upper stop frequency of the passband and the (Continued)

second microelectromechanical resonator system exhibits a softening nonlinear behavior defining a lower stop frequency of the passband.

20 Claims, 7 Drawing Sheets

(51) Int. Cl.
    *H03H 9/24*     (2006.01)
    *H03H 11/04*     (2006.01)

(56) References Cited

OTHER PUBLICATIONS

Chen, F. et al., "CMOS-MEMS Resonant RF Mixer-Filters," Proceedings of the 18th IEEE International Conference on Micro Electro Mechanical Systems, Jan. 2005, pp. 24-27, IEEE.

Ilyas, S. et al., "Exploiting Nonlinearities of Micro-Machined Resonators for Filtering Applications," Applied Physics Letters, Jun. 21, 2017, vol. 110, pp. 253508-1-253508-4, AIP Publishing LLC, US.

International Search Report in corresponding/related International Application No. PCT/IB2017/057664, dated Apr. 23, 2018.

Lopez, J.L. et al., "A CMOS-MEMS RF-Tunable Bandpass Filter Based on Two High-Q 22-MHz Polysilicon Clamped—Clamped Beam Resonators," IEEE Electron Device Letters, Jul. 1, 2009, vol. 30, No. 7, IEEE.

Mestrom, R.M.C. et al., "Simulations and Experiments of Hardening and Softening Resonances in a Clamped—Clamped Beam MEMS Resonator," Sensors and Actuators A, May 7, 2010, vol. 162, pp. 225-234, Elsevier B.V.

Pourkamali, S. et al., "Electrically Coupled MEMS Bandpass Filters Part I: With Coupling Element," Sensors and Actuators A, May 3, 2005, vol. 122, pp. 307-316, Elsevier B.V.

Wong, A.-C. et al., Micromechanical Mixer-Filters ("Mixlers"), Journal of Microelectromechanical Systems, Feb. 2004, vol. 13, No. 1, pp. 100-112, IEEE.

Written Opinion of the International Searching Authority in corresponding/related International Application No. PCT/IB2017/057664, dated Apr. 23, 2018.

* cited by examiner

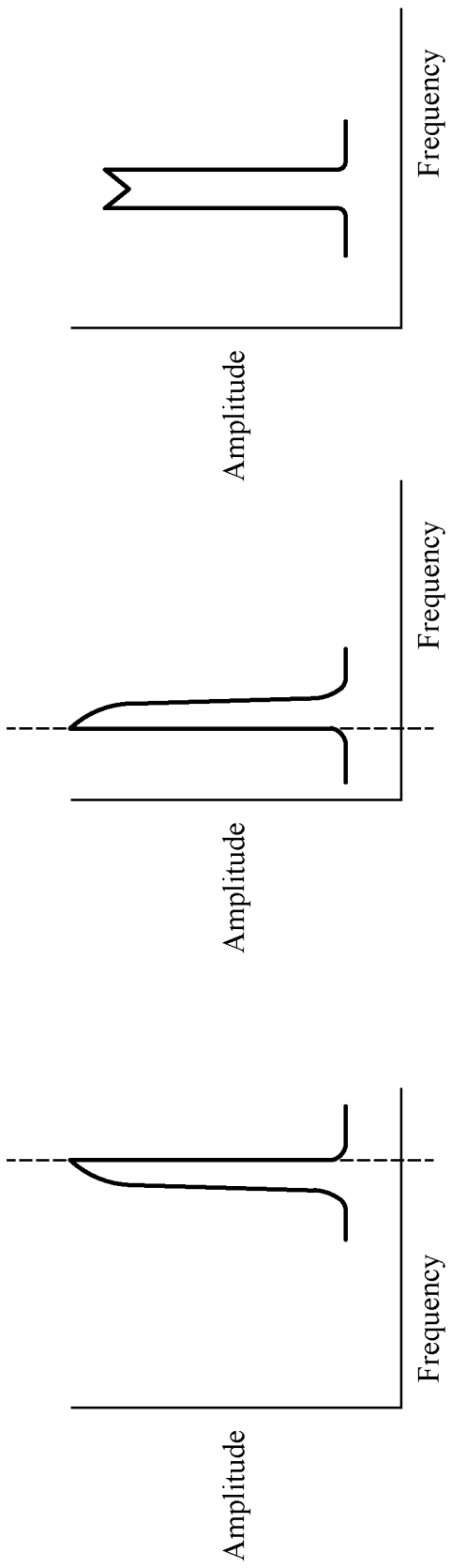

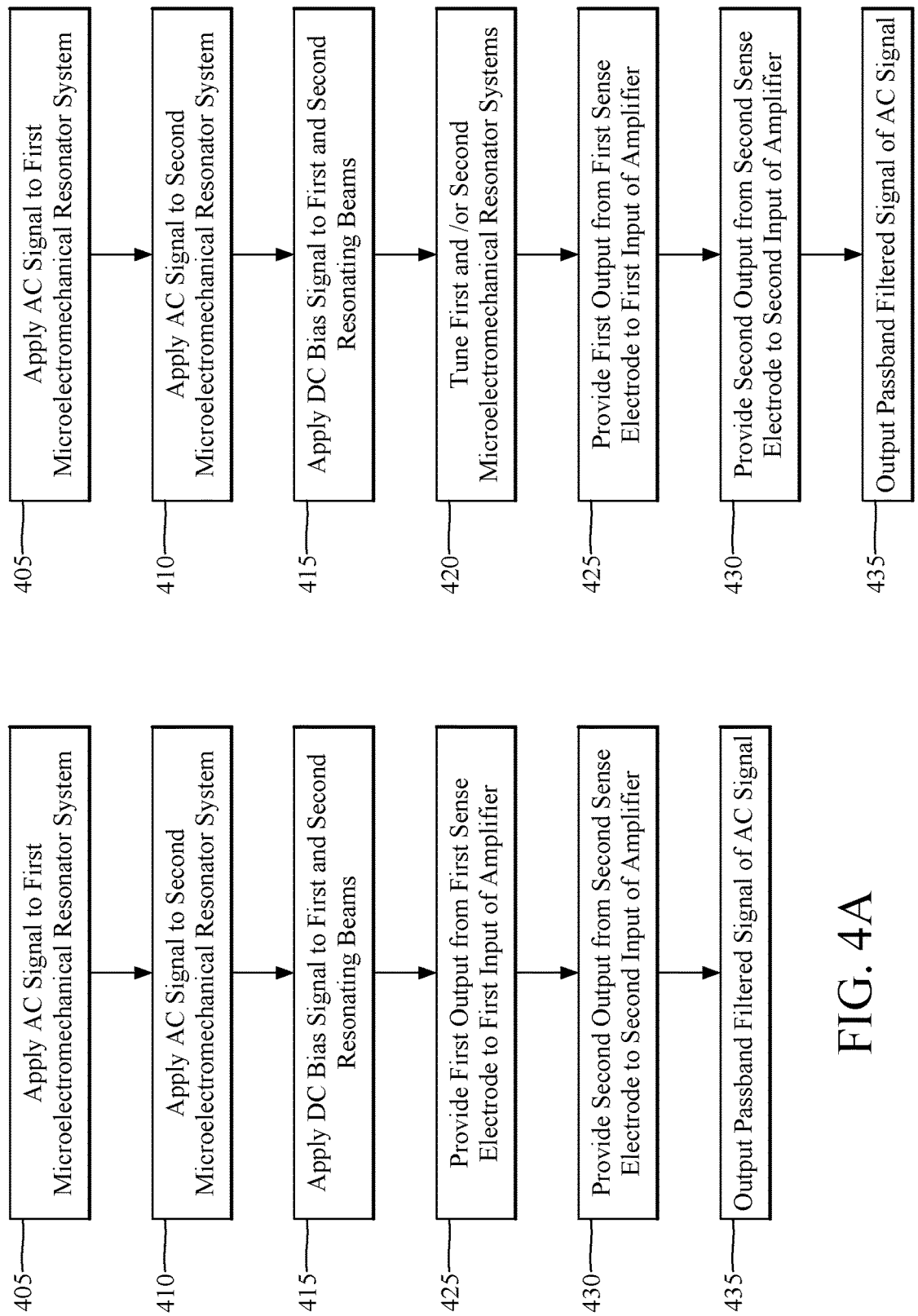

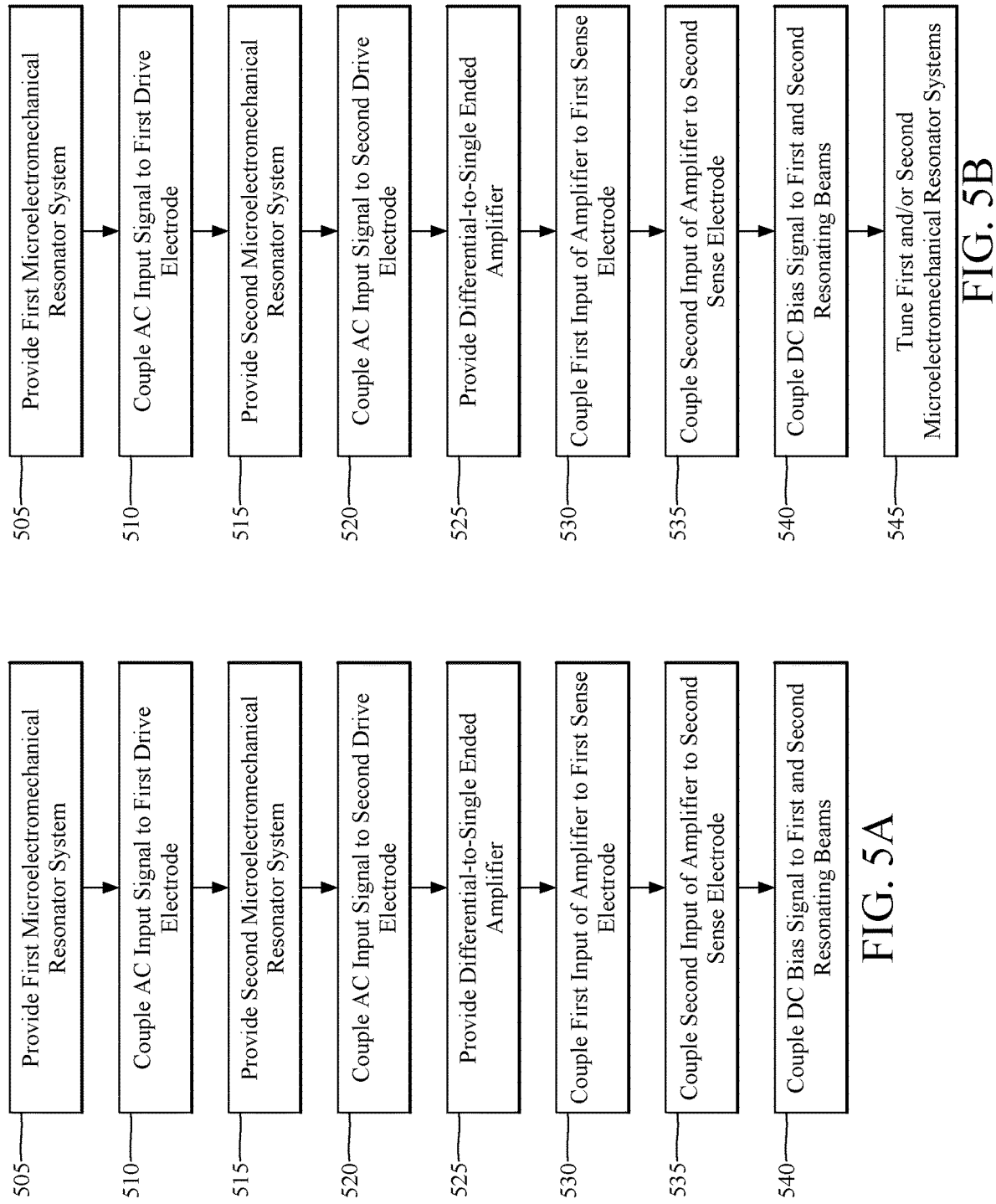

MEMS-BASED PASSBAND FILTER

CROSS-REFERENCE TO RELATED APPLICATIONS

This application is a U.S. National Stage Application of International Application No. PCT/IB2017/057664, filed on Dec. 5, 2017, which claims priority from U.S. Patent Application No. 62/537,226, filed on Jul. 26, 2017, entitled "MEMS FILTER BASED ON NONLINEAR BEHAVIOR OF RESONATORS", the disclosures of which are incorporated herein by reference.

BACKGROUND

Technical Field

Embodiments of the subject matter disclosed herein generally relate to a microelectricalmechanical system- (MEMS-) based passband filter, method for making a MEMS-based passband filter, and method of operation of a MEMS-based passband filter.

Discussion of the Background

Integration of MEMS devices with existing CMOS (complementary metal-oxide-semiconductor) technology is considered to be one of the major advances toward meeting the power consumption and integrations density needs of the future radio-frequency (RF) systems. Among the components of a typical front-end receiver, filters play a vital role. In particular, MEMS resonators have been an attractive area of research for filtering application in RF systems, due to their high-frequency selectivity, high quality factors, and low power consumptions. An ideal filter would have a flat pass band with minimal insertion loss and zero roll off characteristics. Practically implemented MEMS filters today are quite far from these properties.

Conventional MEMS bandpass filters couple two MEMS together to operate as a single MEMS with one drive electrode, one sense electrode, and two resonators. The coupling between the two MEMS can involve a pair of coupling springs or a capacitive coupling. These coupling techniques complicate the design, production, and use of these conventional MEMS bandpass filters.

Accordingly, there is a need for a MEMS-based passband filter that does not require a complicated coupling arrangement between two MEMS.

SUMMARY

According to an embodiment, there is a passband filter. The passband filter includes a first microelectromechanical resonator system, comprising a first resonating beam, a first drive electrode, and a first sense electrode, wherein an AC input signal is coupled to the first drive electrode. The passband filter also includes a second microelectromechanical resonator system, comprising a second resonating beam, a second drive electrode, and a second sense electrode, wherein the AC input signal is coupled to the second drive electrode. The passband filter further includes a differential-to-single ended amplifier having a first input coupled to the first sense electrode and a second input coupled to the second sense electrode, and an output, wherein the output of the differential-to-single ended amplifier is an output of the passband filter that provides a bandpass filtered signal of the AC input signal. A DC bias signal is coupled to the first and second resonating beams. The first microelectromechanical resonator system exhibits a hardening nonlinear behavior defining an upper stop frequency of the passband and the second microelectromechanical resonator system exhibits a softening nonlinear behavior defining a lower stop frequency of the passband.

According to another embodiment, there is a method of passband filtering an AC signal. The AC signal is applied to a first microelectromechanical resonator system, which comprises a first resonating beam. The AC signal is applied to a second microelectromechanical resonator system, which comprises a second resonating beam. A DC bias signal is applied to the first and second resonating beams. A first output from the first microelectromechanical resonator system is provided to a first input of a differential-to-single ended amplifier. A second output from the second microelectromechanical resonator system is provided to a second input of a differential-to-single ended amplifier. The differential-to-single ended amplifier outputs a passband filtered signal of the AC signal. The first microelectromechanical resonator system exhibits a hardening nonlinear behavior defining an upper stop frequency of the passband and the second microelectromechanical resonator system exhibits a softening nonlinear behavior defining a lower stop frequency of the passband.

According to yet another embodiment, there is a method of producing a passband filter. A first microelectromechanical resonator system is provided, the first microelectromechanical resonator system comprises a first resonating beam, a first drive electrode, and a first sense electrode. An AC input signal is coupled to the first drive electrode. A second microelectromechanical resonator system is provided, the second microelectromechanical resonator system comprises a second resonating beam, a second drive electrode, and a second sense electrode. The AC input signal is coupled to the second drive electrode. A differential-to-single ended amplifier is provided. A first input of the differential-to-single ended amplifier is coupled to the first sense electrode. A second input of the differential-to-single ended amplifier is coupled to the second sense electrode. A DC bias signal is coupled to the first and second resonating beams. An output of the differential-to-single ended amplifier is an output of the passband filter that provides a bandpass filtered signal of the AC input signal. The first microelectromechanical resonator system exhibits a hardening nonlinear behavior defining an upper stop frequency of the passband and the second microelectromechanical resonator system exhibits a softening nonlinear behavior defining a lower stop frequency of the passband.

BRIEF DESCRIPTION OF THE DRAWINGS

The accompanying drawings, which are incorporated in and constitute a part of the specification, illustrate one or more embodiments and, together with the description, explain these embodiments. In the drawings:

FIG. 2A is a graph of the non-linear hardening behavior of a clamped-clamped beam MEMS-based filter according to an embodiment;

FIG. 2B is a graph of the non-linear behavior of a buckled clamped-clamped beam MEMS-based filter or a cantilever beam MEMS-based filter according to an embodiment;

FIG. 2C is a graph of a combination of a clamped-clamped beam MEMS-based filter and one of a buckled clamped-clamped beam MEMS-based filter or a cantilever beam MEMS-based filter according to an embodiment;

FIGS. 4A and 4B are flowcharts of methods for filtering using a MEMS-based passband filter according to an embodiment; and FIGS. 5A and 5B are flowcharts of methods for producing a MEMS-based passband filter according to an embodiment.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of MEMS-based resonators. However, the embodiments to be discussed next are not limited to MEMS-based resonators but instead the embodiments can be employed in connection with other types of resonators.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
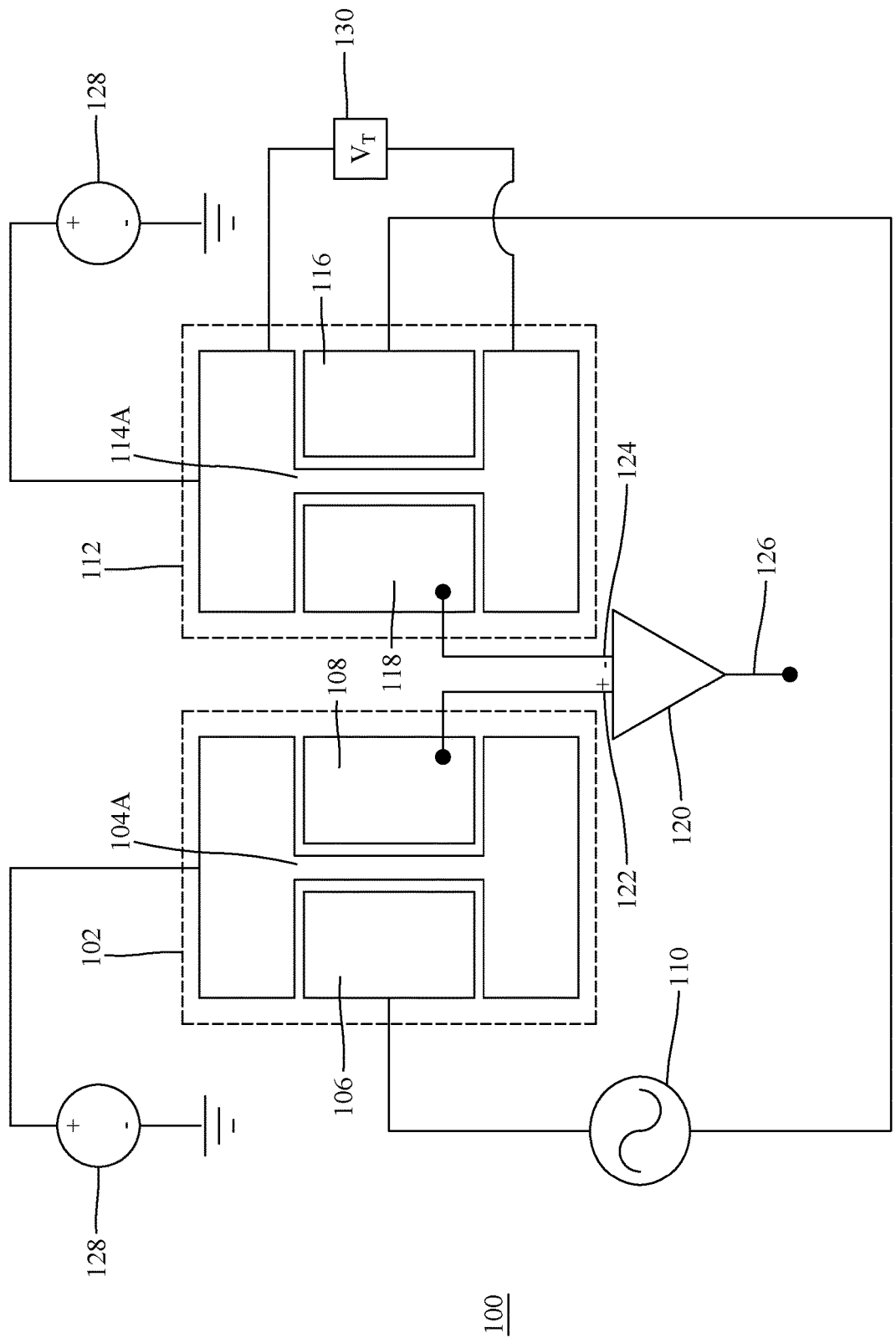
FIG. 1A is a schematic diagram of MEMS-based passband filter according to an embodiment.

Referring now to FIG. 1A, according to an embodiment there is a passband filter 100. The filter 100 includes a first microelectromechanical resonator system 102, comprising a first resonating beam 104A, a first drive electrode 106, and a first sense electrode 108. An AC input signal from AC source 110 is coupled to the first drive electrode 106. The filter 100 also includes a second microelectromechanical resonator system 112, comprising a second resonating beam 114A, a second drive electrode 116, and a second sense electrode 118. The AC input signal 110 is also coupled to the second drive electrode 116. The filter 100 also includes an amplifier 120 having a first input 122 coupled to the first sense electrode 108 and a second input 124 coupled to the second sense electrode 118, and an output 126, which is an output of the passband filter 100 that provides a bandpass filtered signal of the AC input signal. A DC bias signal is coupled to the first 104A and second 114A resonating beams. The first microelectromechanical resonator system 102 exhibits a hardening nonlinear behavior defining an upper stop frequency of the passband and the second microelectromechanical resonator system 112 exhibits a softening nonlinear behavior defining a lower stop frequency of the passband.

An example of nonlinear hardening behavior is illustrated in the graph of FIG. 2A. As illustrated, nonlinear hardening behavior is characterized by an abrupt change in the amplitude (i.e., a sharp roll-off) at and above the resonant frequency (illustrated by the vertical dashed line) but a slower change in amplitude below the resonant frequency. This hardening behavior acts as a high-pass filter. In contrast, nonlinear softening behavior, illustrated in the graph of FIG. 2B, is characterized by an abrupt change in the amplitude (i.e., a sharp roll-off) below and at the resonant frequency (illustrated by the vertical dashed line) but a slower change in amplitude above the resonant frequency. This softening behavior acts as a low-pass filter. Thus, as illustrated in the graph of FIG. 2C, combining the outputs of the first microelectromechanical resonator system 102 exhibiting a hardening nonlinear behavior and the second microelectromechanical resonator system 112 exhibiting a softening nonlinear behavior results in a passband filter. As illustrated, the combination of the nonlinear hardening and softening behavior produces a sharp roll-off from the passbands to the stop bands, which is due to the nonlinear abrupt jumps at both sides of the combined response. Further, a near flat passband can be achieved due to the overlapping of the nonlinear skewed response peaks for the two resonators.

In the illustrated embodiment, the beams 104A and 114A are clamped-clamped beams, meaning both ends of the respective beam are clamped and the portion of the beam between the clamped ends resonate when an AC signal from AC signal source 110 is applied to the drive electrodes 106 and 116. Clamped-clamped beams can exhibit a cubic non-linearity for the hardening behavior, which is the result of the beam mid-plane stretching generated at moderate deflection levels. In order to achieve the nonlinear softening behavior, a DC voltage source 130 is coupled to beam 114A to cause the beam to buckle, at which point it will exhibit a quadratic nonlinearity for the softening behavior.

Applying DC voltage from source 130 changes the stiffness of the beam 114A due to the joule heating caused by current flowing through the beam 114A, which lowers the resonant frequency of beam 114A. As the DC voltage from source 130 increases, beam 114A eventually buckles due to large axial loads. After the onset of the buckling, the stiffness of the beam 114A changes again and the resonant frequency starts increasing with an increasing thermal load. Further, after the onset of buckling, the beam 114A exhibits nonlinear softening behavior.

The particular voltages for causing the onset of the buckling will vary depending upon design of the particular microelectromechanical resonator system. In one embodiment the buckling can occur at a voltage between 1.2 V and 1.4 V.

Figure 1B:
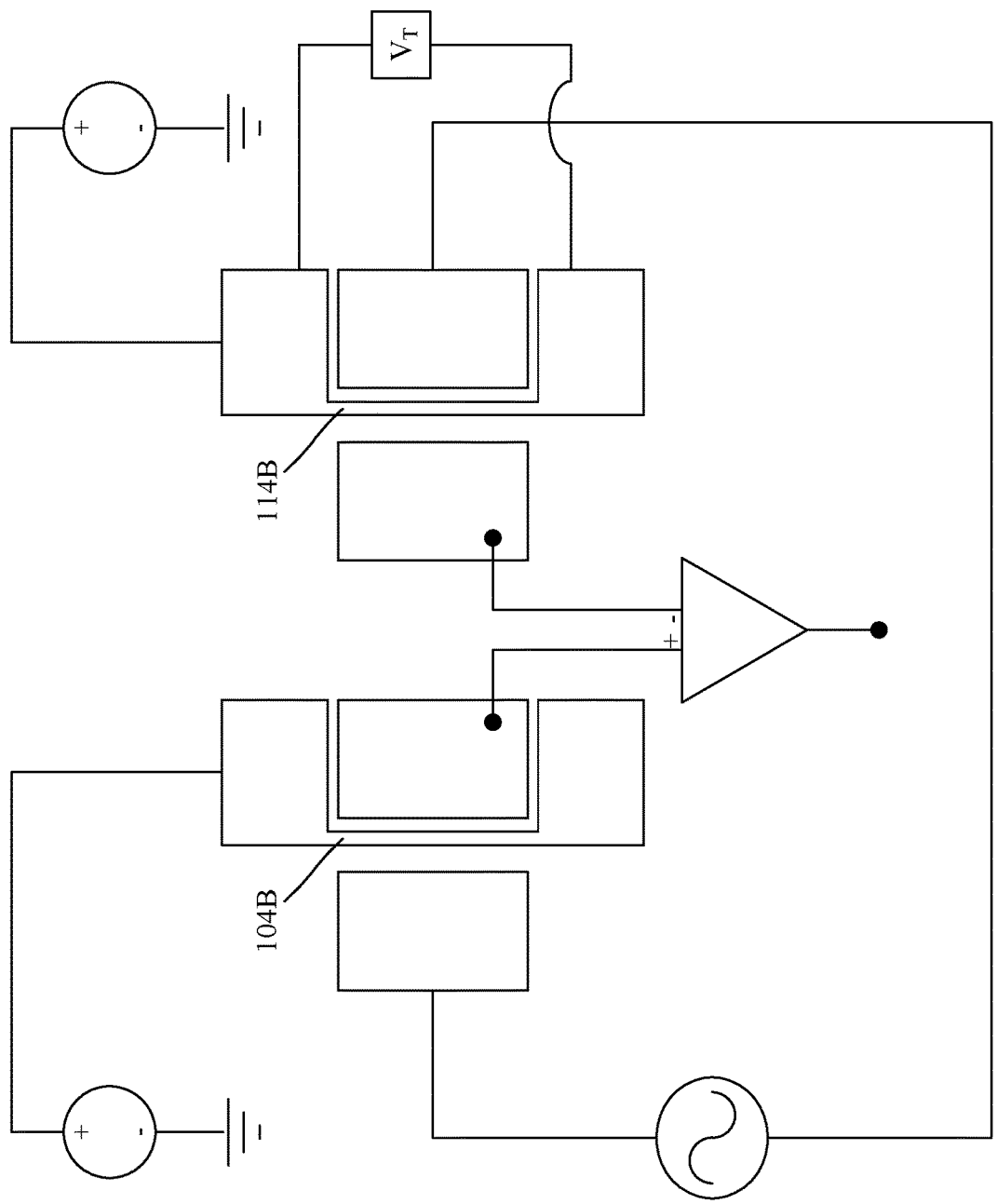
FIG. 1B is a schematic diagram of another MEMS-based passband filter according to an embodiment.

The particular geometry of the clamped-clamped beams 104A and 114A in FIG. 1A is merely exemplary and, as illustrated in FIG. 1B, the clamped-clamped beams 104B and 114B can have a different geometry.

As an alternative to using a buckled clamped-clamped beam 114A to achieve the nonlinear softening behavior, a cantilever beam (not illustrated) can be employed, which naturally exhibits a nonlinear softening behavior.

Figure 1C:
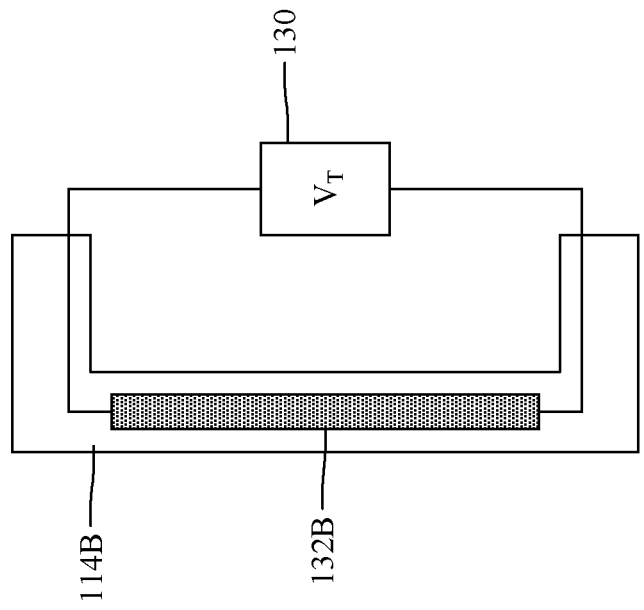
FIG. 1C is a schematic diagram of a heater attached to or integrated with a beam according to an embodiment.
Figure 1D:
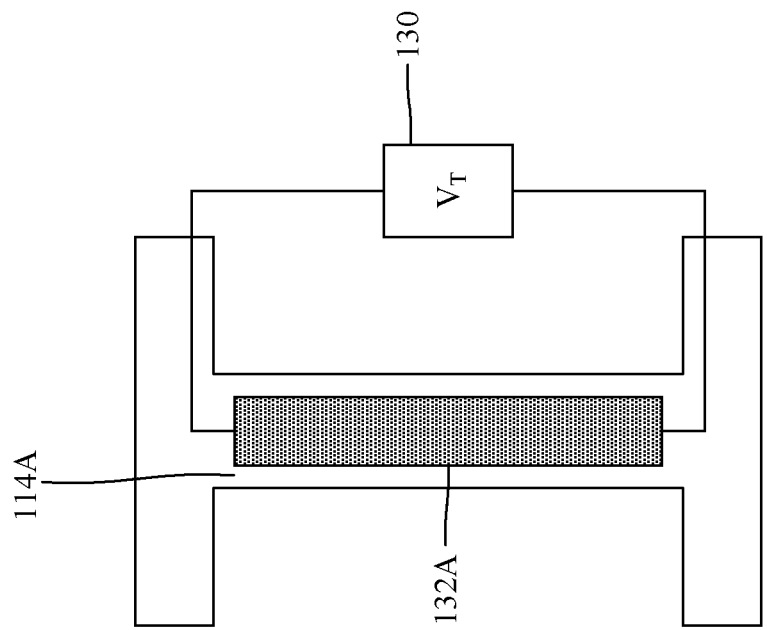
FIG. 1D is a schematic diagram of a heater attached to or integrated with a beam according to an embodiment.

In the embodiments illustrated in FIGS. 1A and 1B, the DC voltage source 130 is applied directly to the beam 114A. Alternatively, as illustrated in FIGS. 1C and 1D, the beam 114A or 114B can have a heater 132A or 132B (either attached to or integrated with the beam 114A or 114B) and the DC voltage source 130 is coupled across the heater 132A or 132B. Although FIGS. 1A and 1B illustrate a common DC bias source 128 being coupled to the first 102 and second 112 resonating beams, different DC sources can be provided for each beam.

In the embodiment illustrated in FIGS. 1A and 1B, the amplifier 120 can be a differential-to-single ended amplifier, which combines the signals from sense electrodes 108 and 118, differentially amplifies the combined signal and outputs the differentially amplified combined signal to output 126. This differentially amplified combined signal corresponds to portions of the AC input signal from AC source 110 that are within the passband of the bandpass filter 100.

The bandpass filter 100 can be operated in air. If lower operating voltages are desired, the bandpass filter 100 can be operated under a moderate vacuum, e.g., 1 torr.

Figure 3:
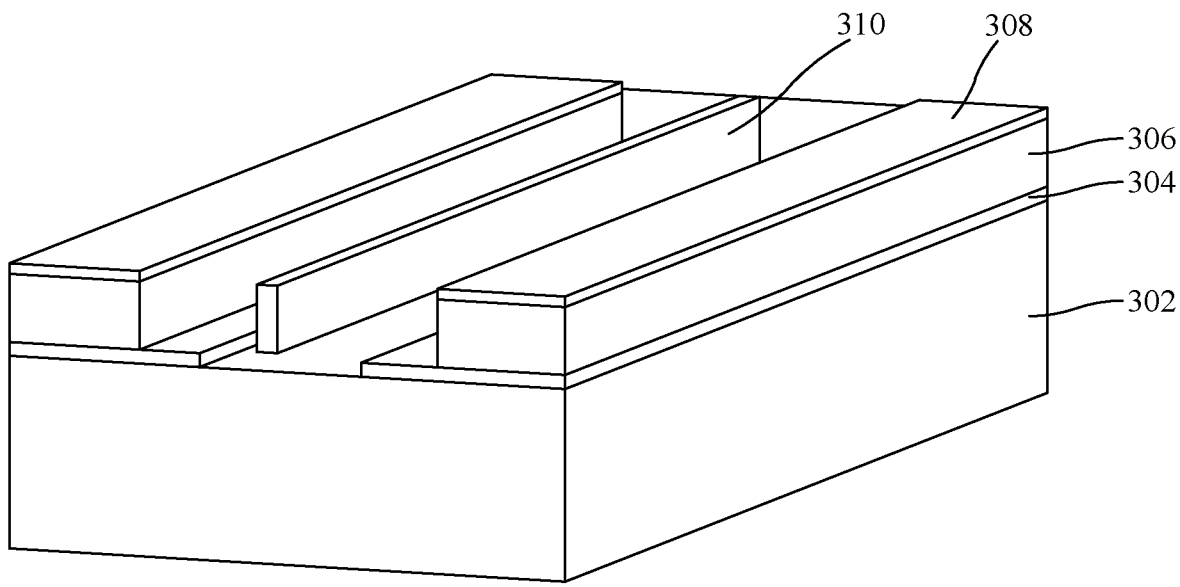
FIG. 3 is a cross-sectional schematic diagram of a clamped-clamped beam according to an embodiment.

FIG. 3 illustrates a cross-section of a microelectromechanical resonator system according to an embodiment, which can be the first and/or second microelectromechanical resonator systems 102 and 112. In the illustrated embodiment, the microelectromechanical resonator system 300 is formed as a silicon on insulator (SOI) type device. Accordingly, the microelectromechanical resonator system 300 includes a silicon substrate 302 (also referred to in the art as a handle layer) on which a silicon oxide $SiO_2$ layer 304 (also referred to in the art as the box layers) is formed to separate (and insulate) the silicon substrate 302 from silicon device layer 306. It should be recognized that layer 304 is formed as a full layer on the handle layer 302 and then selectively etched to remove portions to release the beam 310 so that the beam 310 can move. In an embodiment, the substrate 302 is 500 µm high and the silicon oxide $SiO_2$ layer 304 is 2 µm high. The silicon device layer 306 is arranged on the box layers 304, and conducting pads 308 are arranged on the silicon device layer 306. It should be recognized that the silicon device layer 306 is a single layer that is selectively etched to achieve the pattern illustrated in FIG. 3. In an embodiment, the device layer 306 is 30 µm high, and the conducting pads are Cr/Au pads with the Cr being 50 nm high and the Au being 250 nm high. A beam 310 is arranged between the two conducting pads 308. In an embodiment, the length of the portion of the beam 310 between the conducting pads 308 (i.e., the portion between the two clamped ends) is 600 µm long, 30 µm high, 3 µm wide, and spaced apart from the corresponding electrodes by 8 µm. These dimensions are merely examples of dimensions that can be used, and microelectromechanical resonator systems having different dimensions can be employed in connection with the present invention.

The microelectromechanical resonator system 300 can be fabricated using a two-mask surface micromachining process using highly conductive (resistivity of 0.001 ohm·cm) p-doped Silicon on Insulator (SOI) wafer. The silicon layer is patterned, etched, and released to form the microelectromechanical resonator system 300.

Use of the MEMS-based passband filter will now be described in connection with the flowcharts illustrated in FIGS. 4A and 4B, as well as the passband filter illustrated in FIG. 1A. Initially, an AC signal to be filtered from AC source 110 is applied to the drive electrode 106 of the first microelectromechanical resonator system 102 (step 405) and to the drive electrode 116 of the second microelectromechanical resonator system 112 (step 410). A DC bias signal from DC bias source 128 is applied to the first 104A and second 114A resonating beams (step 415). A first output from sense electrode 108 is provided to a first input 122 of amplifier 120 (step 425) and a second output from sense electrode 118 is provided to a second input 124 of amplifier 120 (step 430). The amplifier 120 then provides the passband filtered signal at output 126 (step 435).

In order to set the initial resonance frequency of the resonating beams 104A, 104B, 114A, and 114B, the microelectromechanical resonator systems can be tuned, which is illustrated as step 420 in the flowchart of FIG. 4B. This tuning can be achieved by adjusting the DC bias signal from DC bias source 128. It will be recognized that even when these microelectromechanical resonator systems are manufactured to be identical, manufacturing tolerances typically results in their resonance frequencies deviating from each other. In many applications using two identical resonators this resonance frequency deviation needs to be addressed by additional tuning so that there is a common resonance frequency. In the present disclosure, however, this difference is not a concern because the resonance frequency of the first 104A or 104B and the second 114A or 114B resonating beams should be different in order to define the passband.

Tuning as part of step 420 may also be required to define the upper and lower stop frequencies of the passband filter (i.e., the bandwidth and the center frequency of the passband), which will typically be required regardless of whether the passband filter employs two clamped-clamped beam microelectromechanical resonator systems or one clamped-clamped beam microelectromechanical resonator system and one cantilever beam microelectromechanical resonator system. However, in the case of a two clamped-clamped beam passband filter, one of the clamped-clamped beam microelectromechanical resonator systems also needs to be tuned by buckling using the DC voltage source 130 so that it exhibits the nonlinear softening behavior.

The bandwidth of the passband filter 100 can be tuned by adjusting the DC voltage applied across one of the beams 104A (104B) or 114A (114B). In the illustrated embodiment, this is performed by applying a DC voltage from the DC voltage source 130 to beam 114A or 114B. Alternatively, this tuning can be performed using a further DC voltage source applied across beam 104A or 104B (not illustrated) for tuning beam 104A or 104B. In a clamped-clamped beam arrangement, regardless of which beam is tuned using a DC voltage, one of the beams still requires application of DC voltage so as to cause the beam buckling and the resulting nonlinear softening behavior.

The center frequency of the passband can be achieved by independently applying a DC voltage from the DC voltage source 130 to resonating beam 114A or 114B and a further DC voltage from a further DC voltage source (not illustrated) to resonating beam 104A or 104B. By tuning the bandwidth and center frequency in this manner, the upper and lower stop frequencies of the passband are defined.

The tuning of the bandwidth and passband are performed after the beam 114A or 114B exhibits nonlinear softening behavior due to the buckling caused by applying the DC voltage source 130 to resonating beam 114A or 114B. Because, as discussed above, after buckling the resonance frequency of beam 114A or 114B increases as the voltage increases, the additional tuning of the resonating beam 114A or 114B to define the bandwidth of the passband and/or the center frequency of the passband involves increasing the resonance frequency of the resonating beam 114A or 114B, whereas the additional tuning of the resonating beam 104A or 104B can involve either lowering the resonance frequency of the resonating beam 104A or 104B by increasing the applied DC voltage (while avoiding voltages that cause buckling) or increasing the resonance frequency of the resonating beam 104A or 104B by lowering the applied DC voltage.

In addition to tuning the upper and lower stop frequencies of the passband filter using the DC bias signal from DC bias source 128 and the DC voltage from source 130, it will be recognized that these frequencies can also be defined based on the dimensions of the components of the microelectromechanical resonator systems 102 and 112, as well as the materials used for the components of the microelectromechanical resonator systems 102 and 112. Thus, the desired bandwidth and center frequency should be considered when selecting the dimensions and materials used for the components of the microelectromechanical resonator systems 102 and 112 so that the tuning can achieve the desired bandwidth and center frequency.

For ease of explanation, and not limitation, certain steps are described as being performed serially in FIGS. 4A and 4B. It will be recognized that one or more these steps can be performed in parallel and/or in a different order. For example, the application of the AC signal to the first 102 and second 112 microelectromechanical resonator systems can be performed in parallel, and/or can be performed after the DC bias signal is applied to the first 104A and second 114A resonating beams.

A method for producing a MEMS-based passband filter will now be described in connection with FIGS. 5A and 5B, as well as FIG. 1A. Initially, a first microelectromechanical resonator system 102 is provided (step 505) and an AC input signal from AC source 110 is coupled to the first drive electrode 106 of the first microelectromechanical resonator system 102 (step 510). A second microelectromechanical resonator system 112 is then provided (step 515) and the AC input signal from AC source 110 is coupled to the second drive electrode 116 of the second microelectromechanical resonator system 112 (step 520).

An amplifier 120 is provided (step 525), a first input 122 of the amplifier 120 is coupled to the first sense electrode 108 (step 530), and a second input 124 of the amplifier 120 is coupled to the second sense electrode 118 (step 535). A DC bias signal from DC bias source 128 is then coupled to the first 104A and second 104B resonating beams (step 540).

As discussed above, for a number of reasons it may be necessary to tune the first 102 and second 112 microelectromechanical resonator systems, and thus the method illustrated in FIG. 5B includes an additional tuning step 545.

For ease of explanation, and not limitation, certain steps are described as being performed serially in FIGS. 5A and 5B. It will be recognized that one or more these steps can be performed in parallel and/or in a different order similar to the discussion above in connection with FIGS. 4A and 4B. For example, the coupling of the AC input signal to the first and second microelectromechanical resonator systems 102 and 112 can be performed in parallel, and/or can be performed after the DC bias signal is coupled to the first 104A and second 114A resonating beams.

The disclosed embodiments provide MEMS-based passband filter. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A passband filter, comprising:
    a first microelectromechanical resonator system, comprising a first resonating beam, a first drive electrode, and a first sense electrode, wherein an AC input signal is coupled to the first drive electrode;
    a second microelectromechanical resonator system, comprising a second resonating beam, a second drive electrode, and a second sense electrode, wherein the AC input signal is coupled to the second drive electrode;
    a differential-to-single ended amplifier having a first input coupled to the first sense electrode and a second input coupled to the second sense electrode, and an output, wherein the output of the differential-to-single ended amplifier is an output of the passband filter that provides a bandpass filtered signal of the AC input signal;
    a DC bias source configured to apply a DC bias signal to the first and second resonating beams to tune an initial resonance frequency of the first and second resonating beams; and
    a DC voltage source configured to apply a DC voltage only to the second resonating beam, to cause the second resonating beam to buckle,
    wherein the first microelectromechanical resonator system exhibits a hardening nonlinear behavior defining an upper stop frequency of the passband and the second microelectromechanical resonator system exhibits a softening nonlinear behavior, due to the applied DC voltage, the softening nonlinear behavior defining a lower stop frequency of the passband.

2. The passband filter of claim 1, wherein the first resonating beam is a clamped-clamped beam and the second resonating beam is a cantilevered beam.

3. The passband filter of claim 1, wherein the first and second resonating beams are clamped-clamped beams.

4. The passband filter of claim 3, wherein the second resonating beam includes a heater and the DC voltage is applied to the heater.

5. The passband filter of claim 3, wherein the DC voltage is applied across the second resonating beam.

6. The passband filter of claim 5, wherein the second resonating beam is buckled and the first resonating beam is unbuckled.

7. The passband filter of claim 6, wherein the DC voltage causes the second beam to buckle and defines the lower stop frequency of the second microelectromechanical resonator system.

8. The passband filter of claim 7, wherein a further DC voltage is applied across the first resonating beam to define the upper stop frequency of the first microelectromechanical resonator system.

9. A method of passband filtering an AC signal, the method comprising:
    applying the AC signal to a first microelectromechanical resonator system, which comprises a first resonating beam;
    applying the AC signal to a second microelectromechanical resonator system, which comprises a second resonating beam;

applying a DC bias signal, with a DC bias source, to the first and second resonating beams to tune an initial resonance frequency of the first and second resonating beams;

applying a DC voltage, with a DC voltage source, only to the second resonating beam, to cause the resonating beam to buckle;

providing a first output from the first microelectromechanical resonator system to a first input of a differential-to-single ended amplifier;

providing a second output from the second microelectromechanical resonator system to a second input of a differential-to-single ended amplifier; and outputting, by the differential-to-single ended amplifier, a passband filtered signal of the AC signal, wherein the first microelectromechanical resonator system exhibits a hardening nonlinear behavior defining an upper stop frequency of the passband and the second microelectromechanical resonator system exhibits a softening nonlinear behavior, due to the applied DC voltage, defining a lower stop frequency of the passband.

10. The method of claim 9, wherein the first microelectromechanical resonator system further comprises a first resonating beam a first drive electrode and a first sense electrode; and the second microelectromechanical resonator system further comprises a second drive electrode and a second sense electrode.

11. The method of claim 9, wherein the first and second resonating beams are clamped-clamped beams and the second resonating beam includes a heater, the method further comprising:

applying the DC voltage to the heater so that the second resonating beam buckles.

12. The method of claim 9, wherein the first and second resonating beams are clamped-clamped beams, the method further comprising:

applying the DC voltage to the second resonating beam so that the second resonating beam buckles.

13. The method of claim 12, further comprising:

defining the lower stop frequency of the second microelectromechanical resonator system by controlling the application of the DC voltage to the second resonating beam.

14. The method of claim 12, further comprising:

defining the lower stop frequency of the second microelectromechanical resonator system and the upper stop frequency of the first microelectromechanical resonator system by controlling the application of the DC bias signal to the first and second resonating beams.

15. The method of claim 12, further comprising:

defining the upper stop frequency of the first microelectromechanical resonator system by applying a further DC voltage to the first resonating beam.

16. A method of producing a passband filter, the method comprising:

providing a first microelectromechanical resonator system, comprising a first resonating beam, a first drive electrode, and a first sense electrode;

coupling an AC input signal to the first drive electrode;

providing a second microelectromechanical resonator system, comprising a second resonating beam, a second drive electrode, and a second sense electrode;

coupling the AC input signal to the second drive electrode;

providing a differential-to-single ended amplifier;

coupling a first input of the differential-to-single ended amplifier to the first sense electrode;

coupling a second input of the differential-to-single ended amplifier to the second sense electrode;

coupling a DC bias source to provide a DC bias signal to the first and second resonating beams to tune an initial resonance frequency of the first and second resonating beams; and coupling a DC voltage source to provide a DC voltage only to the second resonating beam, to cause the second resonating beam to buckle, wherein an output of the differential-to-single ended amplifier is an output of the passband filter that provides a bandpass filtered signal of the AC input signal, and wherein the first microelectromechanical resonator system exhibits a hardening nonlinear behavior defining an upper stop frequency of the passband and the second microelectromechanical resonator system exhibits a softening nonlinear behavior, due to the applied DC voltage, the softening nonlinear behavior defining a lower stop frequency of the passband.

17. The method of claim 16, wherein the first resonating beam is a clamped-clamped beam and the second resonating beam is a cantilevered beam.

18. The method of claim 16, wherein the first and second resonating beams are clamped-clamped beams.

19. The method of claim 18, wherein the second resonating beam includes a heater and the DC voltage is applied to the heater to cause the second resonating beam to buckle.

20. The method of claim 18, further comprising:

tuning the passband filter by adjusting the DC voltage applied to the second resonating beam.

* * * * *